United States Patent [19]

Golda et al.

[11] 4,326,020

[45] Apr. 20, 1982

[54] METHOD OF MAKING POSITIVE ACTING DIAZO LITHOGRAPHIC PRINTING PLATE

[75] Inventors: Eugene Golda, Monsey; Alan Wilkes, Brewster, both of N.Y.

[73] Assignee: Polychrome Corporation, Yonkers, N.Y.

[21] Appl. No.: 185,843

[22] Filed: Sep. 10, 1980

[51] Int. Cl.$^3$ .............................................. G03F 7/08
[52] U.S. Cl. ................... 430/302; 430/155; 430/156; 430/157; 430/163; 430/175; 430/176; 430/309; 430/326; 430/328
[58] Field of Search ............... 430/155, 156, 157, 163, 430/175, 326, 302, 176, 309, 328

[56] References Cited

U.S. PATENT DOCUMENTS

| | | | |
|---|---|---|---|
| 3,113,023 | 12/1963 | Mellon | 430/163 |
| 3,153,592 | 10/1964 | Klimkowski et al. | 430/163 |
| 3,211,553 | 10/1965 | Ito | 430/175 |
| 3,219,447 | 11/1965 | Neugebauer et al. | 430/157 |
| 3,300,309 | 1/1967 | Chu | 430/175 |
| 3,373,021 | 3/1968 | Adams et al. | 430/163 |
| 3,479,182 | 11/1969 | Chu | 430/156 |
| 3,544,317 | 12/1970 | Yonezawa | 430/175 |
| 3,778,270 | 12/1973 | Roos | 430/326 |
| 3,804,621 | 4/1974 | McIntosh | 430/326 |
| 3,890,152 | 6/1975 | Ruckert et al. | 430/175 |
| 3,929,488 | 12/1975 | Smith | 430/326 |
| 4,104,072 | 8/1978 | Golda et al. | 430/155 |

FOREIGN PATENT DOCUMENTS 1353583  5/1974  United Kingdom ............... 430/328

OTHER PUBLICATIONS

Jorgensen, G. et al., "The Sensitivity Guide" 2nd Ed., Research Bulletin, Litho. Tech. Foundation, 1959, pp. 1-39.

Primary Examiner—Charles L. Bowers

[57] ABSTRACT

Described is a lithographic element which may optionally be used as a positive working or a negative working element by minor changes in exposure and development parameters.

12 Claims, No Drawings

METHOD OF MAKING POSITIVE ACTING DIAZO LITHOGRAPHIC PRINTING PLATE

BACKGROUND OF THE INVENTION

This invention relates to a novel method of producing a photographic element, such as a lithographic printing plate, which, may optionally be employed as either a positive working or a negative working element merely by altering the relevant exposure and developing parameters.

Heretofore lithographic printing plates were capable of use solely as a positive working or a negative working plate. In a negative plate system, a substrate was coating with a diazonium salt admixed in an oleophilic resin. Such a plate was then exposed through a photographic transparency and the light struck areas became highly insoluble. As a result of this solubility differential, the unexposed areas, which remain soluble in a developer are able to be washed away and the exposed areas on the plate remain adhered to the substrate. In a positive working system, an aromatic diazo oxide composition is applied to a substrate and exposed. In this type of system the exposed portion of the element is removed by a developer while the unexposed portion remains adhered to the substrate. It has not been previously possible to convert a negative plate type to operate positively or vice versa at least without elaborate treatment techniques which are not economically feasible. By the present invention a single plate may be made to operate either positively or negatively with development by tap water solely by alternating the exposure and developer parameters.

DESCRIPTION OF THE PRIOR ART

U.S. Pat. No. 4,104,072 issued to Golda et al, provides a lithographic printing plate which is developable solely by the use of water. However, this patent teaches the manufacture of both positive and negative working plates by means of changing the photosensitive compositions employed. Hence it does not teach a method of making a positive printing plate using a negative working photosensitizer.

SUMMARY OF THE INVENTION

The present invention provides a photographic element which is developable by ordinary tap water and which is alternatively positive working or negative working.

By the instant invention it has been found that a satisfactory plate which meets these criteria may be produced by first applying a layer of a lithographically suitable, light sensitive, water soluble negative working diazonium salt to the surface of a substrate and subsequently coating the diazonium salt layer with a upper layer of a photosensitive composition which comprises a water insoluble lithographic negative working diazonium salt and a water insoluble water permeable resin. This upper level coating composition is characterized as water insoluble, ink receptive, and water permeable. Water permeability means the composition is insoluble in water, yet water may filter through the composition.

It has been unexpectedly found that when such a plate is exposed to a substantial quantity of ultraviolet radiation through a photographic transparency and washed with water a negative reproduction of the transparency image is obtained. However, when a plate is given an exposure equivalent to from 3% to 15% of a normal negative producing exposure and is washed with water, a positive reproduction of the transparency image is obtained.

In a negative working format the upper coating is initially water permeable and upon imagewise exposure through a suitable mask by methods known to the skilled worker the exposed areas are rendered water impermeable and remain ink receptive. In such a negative working system the lower layer is initially water soluble but is rendered water insoluble at the exposed areas while remaining water soluble at the unexposed areas. Therefore, upon washing an imagewise exposed plate with water, the water permeates the negative working photosensitive composition at the unexposed non image area, and reaches and dissolves the water soluble unexposed photosensitive substance under the non image area. These areas which lack adequate foundation may be quickly and easily swept away by a combination of water and a slight rubbing action. Since the imaged areas were rendered non-water permeable upon exposure, water could not reach the firm foundation of the now water insoluble substance beneath the image areas. These areas are therefore not undermined nor lifted away. The water insolubility of the lower image areas adds resistance to the undesirable loosening of the image areas. The imaged areas are thus ink receptive and the bare metal substrate which coincided with the removed non-image areas is by its nature ink repelling. The result is a commercially satisfactory negative working lithographic printing plate.

In a positive format, the upper coating is of course still initially water permeable but the very short exposure duration is not sufficient to render the photosensitive layers water insoluble nor water impermeable. Rather, although the mechanism is not completely understood, the exposure is believed to be only sufficient to release nitrogen gas from the diazonium compounds. This nitrogen, it is theorized, attempts to free itself from the coatings and forms channels in the layers. This in effect renders the upper level coating more water permeable due to such channels at the exposed areas. This permeability differential is sufficient to allow the quick undermining and removal of the exposed areas. As a result, the exposed areas are effectively removed and the unexposed areas remain adhered to the substrate thus forming a developed, commercially acceptable photographic element.

It must be remembered that the unexposed areas of the positive plate are still light sensitive and water permeable although not as permeable as the exposed areas which were removed. As this plate now exists it would quickly deteriorate on a printing press. In order to prevent this, the positive plate is given a substantial exposure to ultraviolet light so as to render it insoluble in the manner that the negative plate was produced. Since this plate has already been developed, no differential is needed at this point between the exposed and unexposed areas.

It is therefore an object of the present invention to provide a commercially acceptable optionally positive or negative working lithographic printing plate which may be developed by using ordinary tap water.

It is a further object of the present invention to provide a commercially acceptable lithographic printing plate which may be developed by using ordinary tap water and does not require the subsequent application of a lacquer or similar substance to the developed image.

It is another object of the present invention to provide a commercially acceptable lithographic printing plate which does not require the use of expensive and ecologically objectionable chemicals for development.

These and other objects of the instant invention will be in part discussed and in part apparent upon consideration of the detailed description of the preferred embodiment as provided hereinafter.

DETAILED DESCRIPTION OF THE PREFERRED EMBODIMENT

As hereinbefore mentioned, the present invention provides for a commercially acceptable, water developable, optionally positive or negative working photographic element.

As the first step in the production of a photographic element, a sheet substrate, preferably aluminum and the alloys thereof, especially those aluminum compositions suitable for the manufacture of lithographic printing plates such as Alcoa 3003 and Alcoa 1100, which may or may not have been pre-treated by standard graining and/or etching and/or anodizing techniques as are well known in the art and also may or may not have been treated with a composition suitable for use as an interlayer for lithographic plates is coated with a layer of a lithographically suitable, light sensitive, water soluble diazonium salt. Said coated substrate is then treated with a stratum of a composition which comprises a water insoluble lithographic photosensitizer and a water insoluble resin. Said upper layer composition is characterized as water insoluble, ink receptive and water permeable prior to exposure to ultraviolet or actinic radiation. The upper layer composition is preferably not a film former which would impede water permeability. In a negative working system, upon imagewise exposure through a mask by methods known to the skilled worker, the aforementioned top layer substance which was initially water permeable is rendered water impermeable at the exposed areas while remaining water permeable at the unexposed areas. This is true only for negative working systems. In a positive working system the upper coating is also initially water permeable and upon exposure the unexposed areas will remain water permeable and the exposed areas are rendered more water permeable than the unexposed portions.

Standard metal substrate pretreatments include electrolytically anodizing in sulfuric, chromic, hydrochloric and/or phosphoric acids or electrolytically etching in hydrochloric or phosphoric acid, and chemical or mechanical graining by methods which are all known to the skilled worker.

Interlayer compositions employable in the practice of this invention include those which may be applied as aqueous solutions, such as aqueous solutions of alkali metal silicates, such as sodium silicate, silicic acid, the Group IV-B metal fluorides, the alkali metal salts or the acids thereof, polyacrylic acid, the alkali metal salts or the acids thereof, the alkali zirconium fluorides, such as potassium zirconium hexafluoride, or hydrofluozirconic acid which are applied in concentrations of 0.5% to 20% by volume.

It has been found in the practice of the instant invention that satisfactory results are obtained when the lower level photosensitive substance comprises a water soluble, minimally or non-organic solvent soluble, lithographically suitable photosensitizer which may or may not be mixed with a water soluble resin, dissolved in water or a combination of water and a water miscible organic solvent.

Water miscible organic solvents useable in the context of the present invention include those having a boiling point of up to 250 degrees F., preferably up to 212 degrees F. and most preferable between 50 degrees F. and 150 degrees F. These include: methanol, ethanol, isopropyl alcohol, acetone, methyl ethyl ketone and methyl cellosolve.

Water soluble photosensitizers employable as part of the invention include:
4-diazo-diphenylamine sulfate
1-diazo-4-N,N-dimethylamino-benzene zinc chloride
1-diazo-4-N,N-diethylamino-benzene zinc chloride
1-diazo-4-N-ethyl-N-hydroxyethylamino-benzene ½ zinc chloride
1-diazo-4-N-Methyl-N-hydroxyethylamino-benzene ½ zinc chloride
1-diazo-2,5-diethoxy-4-benzoylamino-benzene, ½ zinc chloride
1-diazo-4-N-benzylamino-benzene, ½ zinc chloride
1-diazo-4-N,N-dimethylamino-benzene borofluoride
1-diazo-4-morpholino-benzene, ½ zinc chloride
1-diazo-4-morpholino-benzene-borofluoride
1-diazo-2,5-dimethoxy-4-p-tolylmercaptobenzene, ½ zinc chloride
1-diazo-2-ethoxy-4-N,N-dimethylaminobenzene, ½ zinc chloride
p-diazo-dimethyl aniline, ½ zinc chloride
1-diazo-4-N,N-diethylamino-benzene, ½ zinc chloride
1-diazo-2,5-dibutoxy-4-morpholino-benzene sulfate
1-diazo-2,5-diethoxy-4-morpholino-benzene, ½ zinc chloride
1-diazo-2,5-dimethoxy-4-morpholino-benzene, zinc chloride
1-diazo-2,5-diethoxy-4-morpholino-benzene, ½ zinc chloride
1-diazo-2,5-diethoxy-4-morpholino-benzene-borofluoride
2-diazo-1-naphthol-5-sulfonic acid, sodium salt
1-diazo-4-N,N-diethylamino-benzene, borofluoride
1-diazo-2,5-diethoxy-4-p-tolylmercapto-benzene, ½ zinc chloride
1-diazo-3-ethoxy-4-N-methyl-N-benzylamino-benzene, ½ zinc chloride
1-diazo-3-chloro-4-N,N-diethylamino-benzene, ½ zinc chloride
1-diazo-3-methyl-4-pyrrolidino-benzene chloride, zinc chloride
1-diazo-3-methyl-4-pyrrolidino-benzene-borofluoride
1-diazo-2-chloro-4-N,N-dimethylamino-5-methoxybenzene, borofluoride
1-diazo-3-methoxy-4-pyrrolidino benzene, zinc chloride
condensation product of 4-diazo-diphenylamine sulfate and formaldehyde zinc chloride Water soluble resins which may comprise the bottom layer as previously described may include, polyvinyl pyrollidone, polyvinyl alcohols, polyacrylamides and copolymers, synthetic gums such as, starabic, dextrines, natural gums such as, gum arabic and hydroxyethyl cellulose gum.

When a water soluble resin is included as part of the lower level composition the ratio of photosensitizer to resin may broadly range from 100:1 to 1:100 parts by weight.

When a water miscible organic solvent is employed as part of the solution which comprises the lower coating layer, the amount of organic solvent included may be up to that amount which causes a precipitate to form when added to an aqueous solution of the photosensitive substance employed in the lower level.

In a preferred embodiment, the ratio of water to organic solvent may be from about 1:9 to about 9:1 parts by weight. A most preferred ratio is 1:1 parts by weight.

Development speed may be controlled by the relative amounts of water and organic solvent employed. When a greater proportion of water is employed a more continuous film of the lower level substance is formed upon drying which provides stronger bonding to the substrate but a thusly produced plate requires a longer development time. If a greater proportion of organic solvent is used a more discontinuous film of lower level substance is formed upon drying which does not bond as strongly to the substrate but allows quicker development.

A balance of these factors must be selected according to the specific characteristics desired.

The lower level substance is applied to the substrate at a coating weight of from about 5 to about 200 mg/sq.ft., preferably from about 10 to about 100 mg/sq.ft., and most preferably from about 25 to about 60 mg/sq.ft.

Water permeable oleophilic resins usable in the upper coating substance include, epoxy resins (such as, Epon 1031, 1001-1009-Shell Oil Company); polyurethane (such as Goodrich's Estane Series 5714,5715); polyester (for example, DV 521 available from Polychrome Corp.); formvar (such as 12/85 available from Monsanto); urethanes of low molecular weight (such as DV 53, DV 532 available from Polychrome Corp.); butryl resins (commercially available product of Monsanto); polyox (polyethylene oxide series, available from Union Carbide); and polyvinyl hydrogen phthalate.

The water insoluble photosensitive compositions which may be satisfactorily employed in forming the upper layer of this invention are those which are lithographically suitable and are actinic and for ultraviolet light reactive. The photosensitive compositions which may be used as part of this invention are those which are negative acting and include such negative acting photosensitive agents as the aromatic diazo compounds, such as, the reaction product of paradiazo diphenyl amine-para-formaldehyde condensate and 2-hydroxy-4-methoxy benzophenone sulfonic acid. The most satisfactory photosensitive agent may be selected by the skilled worker, depending upon the results sought to be achieved.

The optimum proportion of each ingredient and selection of particular compositions naturally depends on the specific properties desired in the final lithographic plate. Although there is virtually an infinite range to the ratio of the amount of photosensitizer to resin in the upper layer, a practical, operable ratio of sensitizer to resin in the top coating is from about 1 to 10 parts by weight sensitizer to from about 50 to 1 part by weight resin. A preferred ratio is from about 1 to 5 parts by weight sensitizer to from about 10 to 1 part by weight resin. A most preferred ratio is from about 1 to 3 parts by weight sensitizer to from about 4 to 1 part by weight resin.

The coating weight of the photosensitizer-resin upper level composition on the plate is from about 5 to about 300 mg/sq.ft., with a preferred range of from about 35 to about 200 mg/sq.ft., and a most preferred range of from about 50 to about 100 mg/sq.ft.

For the optimum practice of the present invention, the upper coating composition should possess a certain degree of water permeability. The following test has been devised to determine if its water permeability is preferred for the present application.

Water Permeability Test Procedure

1. Dip a sample of 0.008" thick fluted filter paper in a sample of the solution to be tested. A preferred filter is S and S fluted filter #588 available commercially from the Schleicher and Schuell company.

2. Dry the coated filter paper in a 60° F. oven for one hour without allowing exposure to light.

3. Line a funnel with the paper and place the funnel over a flask. Pour 25 mls. of water into the filter paper and record the time required for the water to pass through the filter.

Coatings will require 200 seconds or more to pass through the filter will perform most satisfactorily as positive/negative printing plates.

Obviously the permeability characteristics can be varied with the amount and type of ingredients in the coating.

A thusly produced photographic element may now be used to produce either a positive or negative working image.

Producing a negative working printing plate using a normally negative working photosensitizer is well known to the skilled worker. A given plate is covered with a photographic transparency while mounted on a vacuum frame and exposed to a certain quantity of ultraviolet radiation with a subsequent exposure. In order to test the properties of such a plate, the transparency employed is a 21 Step Sensitivity Guide. This is a clear plastic strip with an optically varying degree of opacity ranging in numbered steps from clear through gray to black. Such a 21 Step Sensitivity Guide is made in accordance with specifications published by the Graphic Arts Technical Foundation in GATF Research Bulletin No. 215. Such a Guide is available commercially by the Stouffer Graphic Arts Equipment Company of South Bend, Ind.

Naturally, plate ingredients and exposures are subject to a myriad of variations. It is therefore necessary to first determine the optimum quantity of light exposure for a given lithographic plate. This is done by exposing a test plate through a 21 Step Sensitivity Guide until a reading in the range of a step 7 through step 9 reading is obtained. For example, a step 9 means that after exposure and development, the highest number which has a visible quantity of coating still remaining on the plate is a step 9 on the Sensitivity Guide reproduction. Those skilled in the art have determined that for a negative working plate, optimum reproduction quality and press life is obtained when a reading of step 7 through step 9 is obtained. If the number is higher, the plate is overexposed with resulting halation, bridging between halftone dots and dot enlargement. If the reading is lower, there is a reduced length of press run and dot sharpening.

Once the optimum number of lumens of light exposure for a negative working step 7-9 has been determined, we have found that an exposure to 20% or more, and preferably 100% of the determined optimum lumen value produces a negative working plate and an exposure in the range of from 3% to 15% of the optimum lumen value will produce a positive working plate. It has furthermore been determined that the developer may be tap water in both cases. A negative plate should preferably be developed in water at a temperature preferably the range of 70° F. to 100° F. and a positive plate should preferably be developed in water at a temperature of 50° to 80° F.

If a positive plate is produced, it should be given a subsequent overall post exposure to harden the previously unexposed areas preferably at the determined optimum lumen value of exposure.

A typical plate is hereinafter demonstrated by the following Example.

EXAMPLE

A sheet of grade 3003 aluminum was chemically etched in 3% sodium hydroxide at 80° C. to obtain a 300 mg/dm$^2$ aluminum etch loss. This was then desmutted in an 8% nitric acid solution and anodized with sulfuric acid in D.C. current at 16 amp. min./ft.$^2$. The sheet was then rinsed in water. The sample was submersed in 5% sodium silicate for 30 seconds at 80° C. to provide an interlayer and rinsed in deionized water. The following solutions were then prepared. All ingredients are in parts by weight.

Formula (A)

2% condensation product of paraformaldehyde and paradiazo diphenylamine
1% phosphoric acid
97% deionized water Formula (B)

2% condensation product of paraformaldehyde and paradiazo diphenylamine reacted with 2-hydroxy, 4-methoxy-5-sulfonic acid.
2.5% bisphenol A epoxy resin (available as Epon 1007 from Shell Chemical Co.)
0.5% polyvinyl acetal resin (available as Formvar 7/95 from Monsanto Chemical Co.)
0.2% Orasol blue G.N. dye
90% ethylene glycol monomethyl ether 4.8% N,N-dimethylformamide The aluminum sheet prepared as above was then first coated with Formula (A) via dip coating to attain a coating weight of 3.4 mg/dm$^2$ and dried for 3 minutes at 55° C. This was subsequently coated with Formula (B) via dip coating to attain a coating weight of 4.0 mg/dm$^2$ and dried for 15 minutes at 65° C. The sample so prepared was cut into 2 sections.

A photographic transparency was placed over one of the sections and was exposed for 30 seconds in a 5 K.W. mercury vapor/metal halide exposure unit. The unexposed area was then removed with a tap water developer at 38° C.

A negative reproduction of the transparency image was produced.

The same photographic transparency was placed over the other plate section and it was exposed for 3 seconds in a 5 KW mercury vapor/metal halide exposure unit. The exposed area was then removed with a tap water developer maintained at a temperature of 18° C. After development the sample was post exposed for 30 seconds with the exposure unit described above. A positive reproduction of the transparency image was produced.

The two samples were then mounted on a Chief 22 Press and produced 25,000 acceptable impressions.

We claim:

1. A method for producing a positive acting lithographic printing plate which comprises:
   (a) Coating at least one surface of a substrate with a first layer comprising a water soluble lithographically suitable, light sensitive, negative acting aromatic diazo composition; and
   (b) applying to said first layer, a second layer comprising a water insoluble, ink receptive, water permeable negative working lithographic photosensitive composition which comprises:
     (i) at least one water insoluble, water permeable, oleophilic resin selected from the group consisting of epoxy resins, polyurethane, polyester, urethane, poly(ethylene oxides), poly(vinyl hydrogen phthalate), poly(vinyl acetals) and poly(vinyl butyral) resins; and
     (ii) The light-sensitive reaction product of a diazo diphenylamine-formaldehyde condensate with a benzophenone sulfonic acid; and
   (c) determining on a sample of the coated substrate of step 1(b) the optimum amount of light, in lumens or equivalent, necessary to produce a GATF step 7 to step 9 negative working plate; and
   (d) in an imaging step exposing the construction of step 1(b) to 3 to 15% of the "optimum amount of light" determined in step (c); and
   (e) developing said exposed construction by washing with a developer comprising water whereby the light exposed areas of the two layers formed in steps (a) and (b) are removed; and then
   (f) post exposing the developed construction to the above optimum amount of light for production of a negative-working plate whereby a positive-working lithographic plate is produced.

2. The method of claim 1 wherein said element (b) (ii) is the reaction product of the condensation of paradiazo diphenyl amine with formaldehyde or paraformaldehyde and 2-hydroxy 4-methoxy benzophenone sulfonic acid.

3. The method of claim 2 wherein said substrate is comprised of aluminum.

4. The method of claim 3 wherein said substrate has been grained.

5. The method of claim 4 wherein said grained substrate has been anodized.

6. The method of claim 5 wherein said grained and anodized substrate has applied thereto between the upper surface of said substrate and the first layer, an interlayer composition which comprises a substance selected from the group consisting of alkali metal silicate, silicic acid, the Group IV B metal fluorides, polyacrylic acid, the alkali zirconium fluorides and hydrofluozirconic acid.

7. The method of claim 2 wherein the coating weight of the first layer is from about 5 to about 200 mg/sq.ft. and the coating weight of said second layer is from 5 to about 300 mg/sq.ft.

8. The method of claim 2 wherein the ratio of lithographically suitable photosensitizer to oleophilic resin in said second layer is from about 1 to about 10 parts photosensitizer to from about 50 to about 1 part by weight oleophilic resin.

9. The method of claim 1 wherein said first layer further comprises a composition selected from the group consisting of, polyvinyl pyrrollodone; polyvinyl alcohols; polyacrylamides and copolymers; synthetic gums and natural gums.

10. The method of claim 2 wherein the first layer comprises a composition selected from the group consisting of, 4-diazo-diphenylamine sulfate
1-diazo-4-N,N-dimethylamino-benzene zinc chloride
1-diazo-4-N,N-diethylamino-benzene zinc chloride
1-diazo-4-N-ethyl-N-hydroxyethylamino-benzene ½ zinc chloride
1-diazo-4-N-Methyl-N-hydroxyethylamino-benzene ½ zinc chloride
1-diazo-2,5-diethoxy-4-benzoylamino-benzene, ½ zinc chloride
1-diazo-4-N-benzylamino-benzene, ½ zinc chloride
1-diazo-4-N,N-dimethylamino-benzene borofluoride
1-diazo-4-morpholino-benzene, ½ zinc chloride
1-diazo-4-morpholino-benzene-borofluoride
1-diazo-2,5-dimethoxy-4-p-tolylmercaptobenzene, ½ zinc chloride
1-diazo-2-ethoxy-4-N,N-dimethylaminobenzene, ½ zinc chloride
p-diazo-dimethyl-aniline, ½ zinc chloride
1-diazo-4-N,N-diethylamino-benzene, ½ zinc chloride
1-diazo-2,5-dibutoxy-4-morpholino-benzene sulfate
1-diazo-2,5-diethoxy-4-morpholino-benzene, ½ zinc chloride
1-diazo-2,5-dimethoxy-4-morpholino-benzene, zinc chloride
1-diazo-2,5-diethoxy-4-morpholino-benzene, ½ zinc chloride
1-diazo-2,5-diethoxy-4-morpholino-benzene-borofluoride
2-diazo-1-naphthol-5-sulfonic acid, sodium salt
1-diazo-4-N,N-diethylamino-benzene, borofluoride
1-diazo-2,5-diethoxy-4-p-tolylmercapto-benzene, ½ zinc chloride
1-diazo-3-ethoxy-4-N-methyl-N-benzylamino-benzene, ½ zinc chloride
1-diazo-3-chloro-4-N,N-diethylamino-benzene, ½ zinc chloride
1-diazo-3-methyl-4-pyrrolidino-benzene chloride, zinc chloride
1-diazo-3-methyl-4-pyrrolidino-benzene-borofluoride
1-diazo-2-chloro-4-N,N-dimethylamino-5-methoxy-benzene, borofluoride
1-diazo-3-methoxy-4-pyrrolidino benzene, zinc chloride
condensatiion product of 4-diazo-diphenylamine sulfate and formaldehyde zinc chloride 11. The method of claim 2 wherein said first layer has been coated from a solvent selected from the group consisting of water, and water mixed with a water miscible organic solvent having a boiling point of up to 250° F.

12. The method of claim 11 wherein said water miscible organic solvent is comprised of a composition selected from the group consisting of, methanol, ethanol, isopropyl alcohol, acetone, methyl ethyl ketone and methyl cellosolve.

* * * * *